United States Patent [19]

Miwa

[11] Patent Number: 5,583,065
[45] Date of Patent: Dec. 10, 1996

[54] METHOD OF MAKING A MOS SEMICONDUCTOR DEVICE

[75] Inventor: Hiroyuki Miwa, Kanagawa, Japan

[73] Assignee: Sony Corporation, Tokyo, Japan

[21] Appl. No.: 568,407

[22] Filed: Dec. 6, 1995

Related U.S. Application Data

[63] Continuation of Ser. No. 346,264, Nov. 23, 1994, abandoned.

[51] Int. Cl.$^6$ ............................................. H01L 21/336
[52] U.S. Cl. ............................ 437/41; 437/44; 437/203; 437/228
[58] Field of Search ................. 437/40 RG, 41 RG, 437/44, 203, 228 ES, 228 POL; 257/330

[56] References Cited

U.S. PATENT DOCUMENTS

| | | | |
|---|---|---|---|
| 5,082,795 | 1/1992 | Temple | 437/41 |
| 5,132,238 | 7/1992 | Murakami et al. | 437/41 |
| 5,217,913 | 6/1993 | Watabe et al. | 437/44 |
| 5,270,257 | 12/1993 | Shin | 437/203 |
| 5,316,978 | 5/1994 | Boyd et al. | 437/203 |
| 5,338,958 | 8/1994 | Mitsumoto | 257/330 |
| 5,371,024 | 12/1994 | Hieda et al. | 437/40 |
| 5,378,655 | 1/1995 | Hutchings et al. | 437/203 |

FOREIGN PATENT DOCUMENTS

| | | | |
|---|---|---|---|
| 60-92666 | 5/1985 | Japan | 437/203 |
| 60-124840 | 7/1985 | Japan | 437/78 |
| 61-263277 | 11/1986 | Japan | |
| 1-295462 | 11/1989 | Japan | |
| 3-68173 | 3/1991 | Japan | 257/330 |
| 4-56279 | 2/1992 | Japan | |
| 4-93080 | 3/1992 | Japan | |
| 4-93083 | 3/1992 | Japan | 257/330 |
| 4-159781 | 6/1992 | Japan | 257/330 |

OTHER PUBLICATIONS

Wolf, S., et al., Silicon Processing, vol. 1, 1986, Lattice Press, pp. 175–182.
Patent Abstract of Japan—vol. 017 No. 640 (E–1465, 26 Nov. 1993—JP5206459.
Patent Abstracts of Japan—vol. 16, No. 255 (E–1214 10 06, 1992 JP4056279.
Patent Abstracts of Japan —vol. 11 No. 117 E–498 JP61263277.
Patent Abstracts of Japan—vol. 9, No. 126 31 05 1985 E–318—JP60014471.
Patent Abstracts of Japan—vol. 16, No. 322 E–1233—JP4093080.

Primary Examiner—T. N. Quach
Attorney, Agent, or Firm—Hill, Steadman & Simpson

[57] ABSTRACT

A method of making a semiconductor device wherein fluctuations of an effective length of the conduction area and placement thereof relative to source and drain regions is controlled during manufacture. A first insulation film is formed on a semiconductor substrate. A first thin film is formed on the first insulation film. A trench is formed below a surface of the substrate by etching said first thin film, first insulation film, and semiconductor substrate. A second insulation film is formed along an inside wall of the trench. A first electrically conductive film is formed along an inside wall of the second insulation film within the trench and an embedded electrode is formed within a space defined by said first electrically conductive film. The first thin film is removed and then impurities are introduced into the substrate using the first electrically conductive film as a mask so as to form source and drain with the gate trench being automatically centered between the source and drain region, and a fluctuation of an effective length of a conduction region is avoided.

9 Claims, 2 Drawing Sheets

5,583,065

METHOD OF MAKING A MOS SEMICONDUCTOR DEVICE

This is a continuation of application Ser. No. 08/346,264, filed Nov. 23, 1994, abandoned.

BACKGROUND OF THE INVENTION

1. Field of the Invention

The present invention relates to a method of making a semiconductor, and more particularly to an improvement in making a highly efficient MOS electrode effect transistor.

2. Description of the Related Art

The first problem which arises with the recent miniaturization and higher efficiency of MOS electrode effect transistors is how to suppress the short channel effect. A gate mounted MOS electrode effect transistor technique has been proposed.

This technique suppresses the short channel effect by burrowing down into the silicon substrate in the channel area and virtually increasing the channel length, and furthermore improves the hot carrier resistance by moving the channel area from the source and drain parts.

FIGS. 1A and 1B show a processing flow of this technique. This is a cross sectional view of an N channel MOS transistor formed on the silicon substrate. As shown in FIG. 1A, a LOCOS oxide film 2 for separating elements is formed on the silicon substrate 1, and then a shallow trench 3 is formed in the channel area.

A gate oxide film 4 is then formed on the surface of the substrate including an inner part of the trench with the aid of a rapid thermal technique using an oxide diffusing furnace. In this connection, the LOCOS oxide film 4 is formed with a thickness of 400 to 500 nm and the gate oxide film is formed with a thickness of 10 to 20 nm.

Also in this event, boron ions are input in order to control the threshold voltage Vth.

Furthermore, as shown in FIG. 1B, $N^+$ polysilicon films of a 200 to 400 nm thickness are deposited in trench 3 and on the surface of the substrate by CVD. Then, polysilicon is processed with the aid of an existing dry etching technique to form a gate electrode 5 of a MOS transistor.

Then, $N^+$ ions are input into the MOS transistor and a source diffusion zone 6 and a drain diffusion zone 7 are formed. Then, the source diffusion zone 6 and the drain diffusion zone 7 are activated by the thermal processing and furthermore, each electrode is formed using the existing wiring technique (not shown). The MOS transistor is formed according to the procedure described above.

However, since it is necessary to fit the positions of electrode edges and the shallow trench 3 in the case of processing the gate electrode as shown in FIG. 1B, there is a possibility that the effective gate length $L_{eff}$ changes for the margin. Therefore, there has been a problem that an increase of a scattering of device characteristics and an improvement of the integration factor are prevented.

SUMMARY OF THE INVENTION

In view of the foregoing, an object of the present invention is to provide a method of making a semiconductor which is capable of forming a mounted-type MOS transistor having a high performance characteristic without fear of effective gate length changes.

The foregoing object and other objects of the invention have been achieved by the provision of a method for making a semiconductor comprising the steps of: forming a trench 3 in a depth direction down from the surface of a semiconductor substrate 1; forming an electrically conductive film 14 (15, 16) inside and on the surface of the trench 3 and having its edge at a position which is almost an equal distance from the edge of the trench 3; and forming impurity diffusion zones 17, 18 inside of the semiconductor substrate 1 and having their edges at a position almost an equal distance from the edge of the electrically conductive film 14 (15, 16).

According to the present invention, a semiconductor device is made in accordance with the following method steps: forming the first insulation film 11 on the semiconductor substrate 1; forming the first thin film 12 on the first insulation film 11; etching the semiconductor substrate 1 over the first thin film 12 and the first insulation film 11 to form a trench 3 in a depth direction down from the surface of the semiconductor substrate 1; forming the second insulation film 13 along the inside wall of the trench 3; forming the first electrically conductive film 14 inside of the second insulation film 13 and forming the embedded electrode 15 in the trench 3; removing the first thin film 12; and introducing impurities to the inside of the semiconductor substrate 1 using the first electrically conductive film 14 as a mask.

Moreover, according to the present invention, the semiconductor device is made also in accordance with the following method steps: forming the first insulation film 11 on the semiconductor substrate 1; forming the first thin film 12 on the first insulation film 11; etching the semiconductor substrate 1 over the first thin film 12 and the first insulation film 11 to form the trench 3 in a depth direction down from the surface of the semiconductor substrate 1; forming the second insulation film 13 along the inside wall of the trench 3; forming the first electrically conductive films 14, 15 inside of the second insulation film 13 and forming the embedded electrode in the trench 3; removing the first thin film 12; forming the second electrically conductive film 16 on the inside wall of the part projecting up from the surface of the first insulation film 11 in the first electrically conductive films 14 and 15; and introducing impurities into the inside of the semiconductor substrate using the first and second electrically conductive films 14, 15 and 16 as masks.

Furthermore, according to the present invention, the semiconductor device is also made in accordance with the following method steps: forming the first insulation film 11 on the semiconductor substrate 1; forming the first thin film 12 having a different etching resistance on the first insulation film 11 on the first insulation film 11; etching the semiconductor substrate 1 over the first thin film 11 and the first insulation film 12 to form the trench 3 in a depth direction down from the surface of the semiconductor substrate; forming the second insulation film 13 along the inside wall of the trench 3; forming the first electrically conductive films 14 and 15 inside of the second insulation film 13 and forming the embedded electrode in the trench 3; providing the first electrically conductive films 14 and 15 only in the trench 3 with the aid of a chemical mechanical polishing technique using the first thin film 12 as an etching stopper; removing the first thin film 11; and introducing impurities into the inside of the semiconductor substrate 1 using the first electrically conductive films 14 and 15 as masks.

Moreover, according to the present invention, the semiconductor device is also made in accordance with the following method steps: forming the first insulation film 11 on the semiconductor substrate 1; forming the first thin film 12 having a different etching resistance on the first insulation film 11; etching the semiconductor substrate 1 over the first thin film 12 and the first insulation film 11 to form a trench 3 in a depth direction down from the surface of the semiconductor substrate 1; forming the second insulation film 13 along the inside wall of the trench 3; forming the first electrically conductive films 14 and 15 inside of the second insulation film 13 and forming the embedded electrode in the trench 3; providing the first electrically conductive films 14 and 15 only in the trench 3 with the aid of a chemical mechanical polishing technique using the first thin film as an etching stopper; removing the first thin film 12; forming the second electrically conductive film 16 on the side wall of the part projecting up from the surface of the first insulation film 11 in the first electrically conductive films 14 and 15; and introducing impurities to the inside of the semiconductor substrate using the first and second electrically conductive films 14, 15, and 16 as masks.

The edge of the first and/or second electrically conductive films 14, 15, and/or 16 can be determined by self adjustment for the trench 3. Upon obtaining the highly efficient MOS electrode effect transistor having a mounted gate, positions of the source and trench for the channel part can be determined by self adjustment, and a fluctuation of the effective channel length $L_{eff}$ can be avoided and integration can be improved.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings.

Figures 1A, 1B:
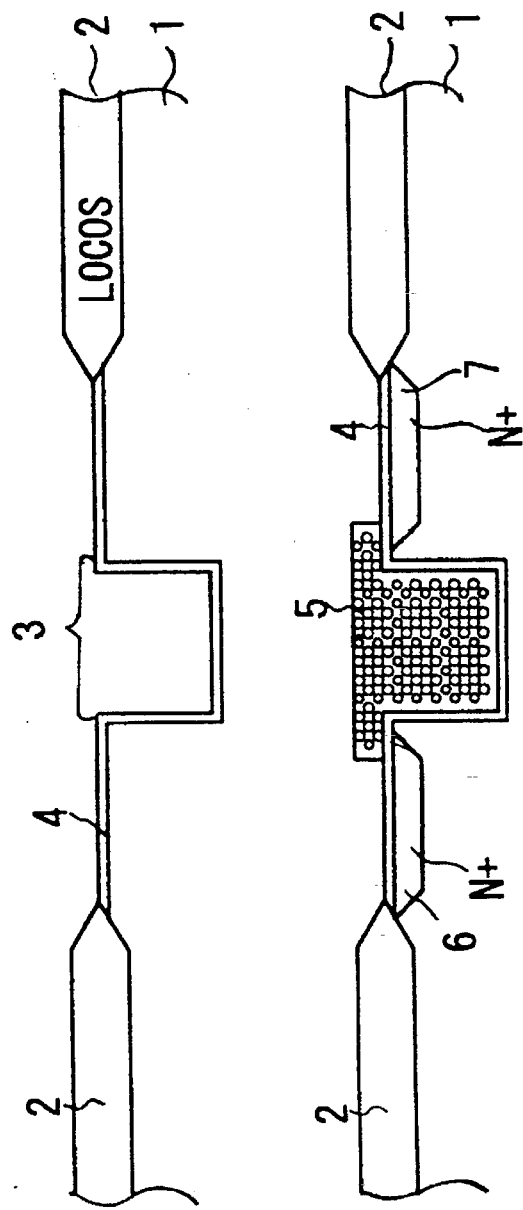
FIGS. 1A and 1B are schematic diagrams explaining a conventional method of making a semiconductor device.
Figure 2A:
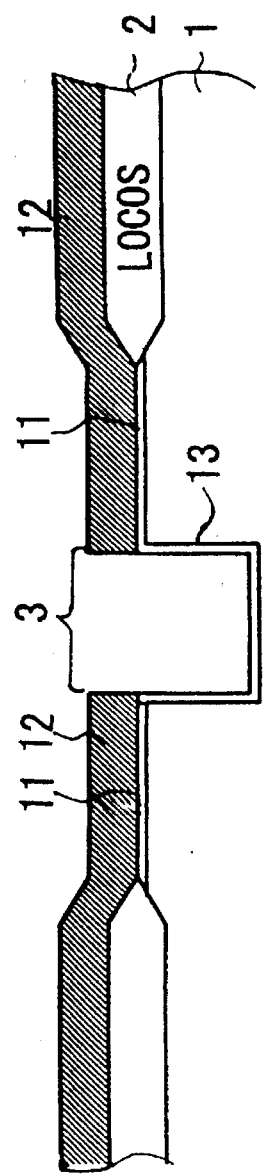
FIGS. 2A to 2C are schematic diagrams showing one embodiment of the method of making a semiconductor device according to the present invention.
Figure 2B:
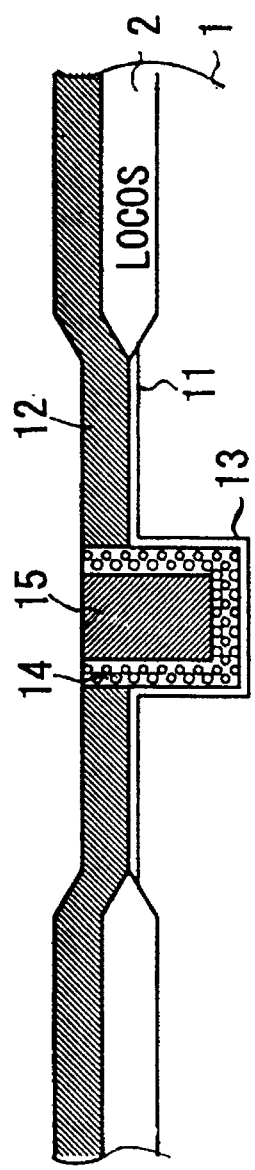
Figure 2C:
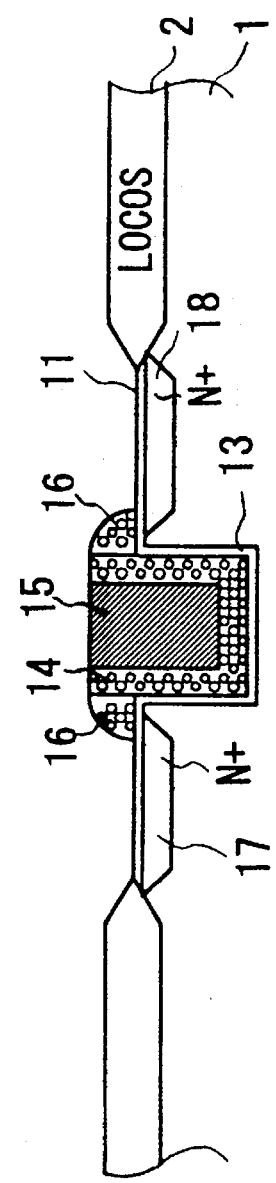

FIGS. 2A to 2C, in which corresponding parts of FIGS. 1A and 1B are given the same reference numerals, show cross sectional views of an N channel MOS transistor formed on a silicon substrate. The manufacturing process is hereinafter described in order referring to FIGS. 2A to 2C. As shown in FIG. 2A, LOCOS oxide film 2 for separating elements is formed on the silicon substrate 1, and then the first gate oxide film 11 is formed in the element forming area.

Then, after forming the silicon nitride film 12 on the entire surface of the wafer by CVD, the channel area is opened using the lithographic technique and etching is conducted successively from the upper surface, the silicon nitride film 12, the first gate oxide film 11, and the silicon substrate 1 using the existing dry etching technique. Thus, a shallow trench 3 is formed.

Then, the second gate oxide film 13 is formed on the inside walls and floor of the shallow trench 3 using a rapid thermal technique by the oxide diffusing furnace.

In this connection, LOCOS oxide film 2 is formed in a thickness of 400 to 500 nm and gate oxide films 11 and 13 are formed with thicknesses of 10 to 20 nm. At this point, boron is introduced in order to control the threshold voltage Vth.

Then, as shown in FIG. 2B, $N^+$ polysilicon film 14 with a thickness of 100 to 200 nm is introduced onto walls and floor within a shallow trench 3 formed by the second gate oxide film 13, and thereafter a tungsten silicon film (WSix) 15 is introduced on walls and floor formed by the polysilicon film 14 within the shallow trench 3. The films 14 and 15 are introduced using a CVD method. Then, the polysilicon film 14 and the tungsten silicon film (WSix) 15 protruding at the upper part of the shallow trench 3 are removed by the chemical mechanical polishing technique using the silicon nitride film 12 formed before as an etching stopper.

As shown in FIG. 2C, the silicon nitride film 12 covering around the shallow trench 3 is removed by using the existing dry etching technique. Regarding the etching being used in this case, a condition in which a high selective ratio can be obtained for the gate oxide film 11 is adopted.

Then, the polysilicon film is laid on the entire surface of the wafer once by CVD. Then, the anisotropic etching is conducted on the polysilicon film, and the side wall 16 is formed on the side wall of the polysilicon film 14. The distance between the edge of shallow trench 3 and the source and drain diffusion zone can be arbitrarily set according to the thickness (width) of the side wall 16.

Hereafter, $N^+$ ions are injected in the MOS transistor part to form the source diffusion zone 17 and the drain diffusion zone 18. Then, the source diffusion zone 17 and the drain diffusion zone 18 are activated by the thermal processing, and each electrode is formed using the existing wiring technique (not shown). With this arrangement, the gate-mounted type MOD transistor is formed.

According to the foregoing processing the gate electrode is formed with the electrically conductive films 14 and 15 mounted in the shallow trench 3, so that the gate electrode can be formed by self-adjustment for the shallow trench 3. Also, since $N^+$ ions are injected using the side wall 16 as a mask to form the source diffusion zone 17 and the drain diffusion zone 18, positions of the source diffusion zone 17 and the drain diffusion zone 18 to the channel part can be decided by self-adjustment.

Accordingly, the conventional problem that the effective channel length $L_{eff}$ changes due to the position shift between the edge of the gate electrode and the edge of the shallow trench 3 can be avoided. Also, the integration can be improved by eliminating margins of the position matching.

Furthermore, in the embodiment described above, the side wall 16 is formed on the side wall of the polysilicon film 14. However, the present invention is not only limited to this, but may form the source diffusion zone 17 and the drain diffusion zone 18 without forming the side wall 16.

Furthermore, in the embodiment described above, the case of an N channel MOS transistor is described. However, the present invention is not only limited to this, but also is applicable to the case of a P channel MOS transistor.

Moreover, in the embodiment described above, the gate electrode is formed with the polysilicon film 14 and the tungsten silicon film (WSix) 15. However, the present invention is not only limited to this, but also it may be formed of silicon, polysilicon, a-silicon and/or laminated films including these components.

Furthermore, the first and second gate oxide films 11 and 13 may be formed of the other insulation films. Similarly, in the embodiment described above, the silicon nitride film 12 is laminated on the surface of the first gate oxide film 11. However, the present invention is not only limited to this, but may laminate the other thin films having a high etching selectivity ratio to the lower zone.

According to the present invention as described above, since it is so arranged that the edge of the first and/or second electrically conductive films can be formed by self adjustment to the trench, and also the position of the edge of the impurity diffusion zone can be formed by self adjustment to the edge of the electrically conductive film, the effective length of the conduction zone can be controlled to be almost constant. Thus, a semiconductor apparatus having higher performance as compared with the past can be realized.

While there have been described preferred embodiments of the invention, it will be obvious to those skilled in the art that various changes and modifications may be provided, and the appended claims cover all such changes and modifications as fall within the spirit and scope of the invention.

What is claimed is:

1. A method of making a semiconductor device, comprising the steps of:

providing a semiconductor substrate;

forming a first insulation film on said semiconductor substrate along with insulating separating elements which are thicker than a thickness of said first insulation film;

forming a first film on said first insulation film, said first film having an etching resistance which is different than said first insulation film;

successively etching the first film, first insulation film, and the substrate to form a trench in the substrate, said trench having inside walls and a floor;

forming a second insulation film along said inside walls and floor of said trench, said second insulation film having inside walls and a floor;

forming a first electrically conductive film along said inside walls and floor of said second insulation film within said trench, said first electrically conductive film having inside walls and a floor;

filling in a space defined by said inside walls and floor of said first electrically conductive film in said trench with an electrically conductive material serving as an embedded gate electrode in said trench;

removing portions of the first electrically conductive film and embedded gate electrode protruding above the trench and above the first film by chemical mechanical polishing using the first film as an etching stopper;

removing the first film from above the first insulation film and around upper portions of said first electrically conductive film and embedded electrode which project above the first insulation film;

after removing said first thin film, forming a second electrically conductive film on the first insulation film and then conducting an etching of the second electrically conductive film so as to form respective side walls directly abutting and alongside opposite portions of the first electrically conducting film extending above said first insulation film, and selecting a thickness of said side walls for defining a distance between said shallow trench and said source and drain zones to be later provided in said substrate, edges of the source and drain zones adjacent the trench being spaced outwardly from said inside walls of said trench; and introducing impurities into said semiconductor substrate between said insulating separating elements and said trench using said embedded gate electrode and said first and second electrically conductive films as a mask to form respective source and drain zones.

2. A method of making a semiconductor device according to claim 1 wherein said second insulation film is formed by rapid thermal oxidation.

3. A method of making a semiconductor device according to claim 1 including the step of forming said source and drain zones by ion-implantation.

4. A method of making a semiconductor device according to claim 1 wherein said first insulation film comprises a gate oxide film and said first film on said first insulation film comprises a silicon nitride film.

5. A method of making a semiconductor device according to claim 1 wherein the insulating separating elements have a thickness in a range of 400–500 nm and said first insulation film and said second insulation film have a thickness in a range of 10–20 nm.

6. A method of making a semiconductor device according to claim 1 including the step of providing said first electrically conductive film as a polysilicon film.

7. A method of making a semiconductor device according to claim 1 including the step of providing said electrically conductive material serving as an embedded gate electrode as a tungsten silicon film introduced with a CVD method.

8. A method of making a semiconductor device according to claim 1 including the step of providing said second electrically conductive film as a polysilicon film and forming said side walls by anisotropic etching.

9. A method of making a semiconductor device according to claim 1 including the step forming said source and drain zones by ion injection followed by a thermal processing activation.

* * * * *